United States Patent
Zhu et al.

(10) Patent No.: US 9,397,233 B2
(45) Date of Patent: Jul. 19, 2016

(54) HIGH VOLTAGE DEEP TRENCH CAPACITOR

(75) Inventors: Ronghua Zhu, Chandler, AZ (US); Vishnu Khemka, Phoenix, AZ (US); Amitava Bose, Tempe, AZ (US); Todd C. Roggenbauer, Chandler, AZ (US)

(73) Assignee: North Star Innovations Inc., Costa Mesa, CA (US)

( * ) Notice: Subject to any disclaimer, the term of this patent is extended or adjusted under 35 U.S.C. 154(b) by 168 days.

(21) Appl. No.: 12/791,996

(22) Filed: Jun. 2, 2010

(65) Prior Publication Data

US 2010/0230736 A1     Sep. 16, 2010

Related U.S. Application Data

(63) Continuation of application No. 11/752,608, filed on May 23, 2007, now Pat. No. 7,732,274.

(51) Int. Cl.
| | | |
|---|---|---|
| H01L 27/108 | (2006.01) | |
| H01L 29/94 | (2006.01) | |
| H01L 27/13 | (2006.01) | |
| H01L 49/02 | (2006.01) | |
| H01L 29/66 | (2006.01) | |

(52) U.S. Cl.
CPC ............... *H01L 29/94* (2013.01); *H01L 27/13* (2013.01); *H01L 28/91* (2013.01); *H01L 29/66181* (2013.01)

(58) Field of Classification Search
CPC ... H01L 27/13; H01L 28/91; H01L 29/66181; H01L 29/94; H01L 27/10876; H01L 27/1203; H01L 21/02164
USPC .................................. 257/300–306, E27.092
See application file for complete search history.

(56) References Cited

U.S. PATENT DOCUMENTS

| | | | |
|---|---|---|---|
| 5,554,870 A * | 9/1996 | Fitch et al. | 257/334 |
| 6,107,135 A | 8/2000 | Kleinhenz et al. | |
| 6,524,926 B1 * | 2/2003 | Allman et al. | 438/387 |
| 2005/0110116 A1 * | 5/2005 | Ishio et al. | 257/532 |
| 2006/0240614 A1 | 10/2006 | Tews | |
| 2006/0246670 A1 | 11/2006 | Khemka et al. | |
| 2008/0258181 A1 * | 10/2008 | Cannon et al. | 257/255 |

OTHER PUBLICATIONS

C. H. Ng et al., "MIM Capacitor Integration for Mixed-Signal/RF Applications," IEEE Transactions on Electron Devices, vol. 52, No. 7, Jul. 2005.
H. Sunami et al., "A Corrugated Capacitor Cell (CCC)," IEEE Transactions on Electron Devices, vol. ED-31, No. 6, Jun. 1984.
S. Nakajima et al., "An Isolation-Merged Vertical Capacitor Cell for Large Capacity DRAM," IEDM 84, 1984.
J. Lützen et al., "Integration of Capacitor for Sub-100-nm DRAM Trench Technology," 2002 Symposium on VLSI Technology Digest of Technical Papers.
K. P. Muller et al., "Trench Storage Node Technology for Gigabit DRAM Generations," IEDM 1996.

* cited by examiner

*Primary Examiner* — Hui Jey Tsai
(74) *Attorney, Agent, or Firm* — Terrile, Cannatti, Chambers & Holland, LLP; Michael Rocco Cannatti

(57) ABSTRACT

A semiconductor process and apparatus provide a high voltage deep trench capacitor structure (10) that is integrated in an integrated circuit, alone or in alignment with a fringe capacitor (5). The deep trench capacitor structure is constructed from a first capacitor plate (4) that is formed from a doped n-type SOI semiconductor layer (e.g., 4*a-c*). The second capacitor plate (3) is formed from a doped p-type polysilicon layer (3*a*) that is tied to the underlying substrate (1).

19 Claims, 5 Drawing Sheets

HIGH VOLTAGE DEEP TRENCH CAPACITOR

CROSS-REFERENCE TO RELATED APPLICATIONS

This application is a continuation of co-pending application No. 11/752,608, filed May 23, 2007, now U.S. Pat. No. 7,732,274 which is incorporated herein by reference in its entirety.

BACKGROUND OF THE INVENTION

1. Field of the Invention

The present invention is directed in general to the field of semiconductor devices. In one aspect, the present invention relates to high-performance integrated circuit capacitor structures.

2. Description of the Related Art

When integrated circuits are formed on semiconductor substrates for use in high voltage applications, the integrated circuit components must be designed to tolerate the high currents and voltages that are present in power applications. For example, integrated circuit capacitors should be able to handle high voltages (e.g., on the order of approximately 40 volts). When an integrated circuit capacitor design did not meet the voltage requirement, one solution is to stack two or more capacitor in series. However, this "series stacking" approach dramatically reduces the capacitance density. Other attempts to design high voltage capacitors have formed large planar conductor plates from one or more metal layers formed over the substrate, but these designs occupy a large region of valuable silicon real estate, resulting in a capacitance density of approximately 0.28-0.3 $fF/um^2$. Other attempts to design integrated circuit capacitors have fabricated DRAM trench capacitors, but there are performance related problems with such designs, particularly when implemented as floating capacitor structures.

Accordingly, a need exists for an integrated circuit manufacturing process for fabricating high voltage capacitor structures which occupy a minimal amount of real estate and provide the required voltage while avoiding the performance-related problems associated with conventional solutions. There is also a need for an improved process for manufacturing integrated circuit capacitors with high capacitance density that overcome the layout and design penalties associated with capacitors that are formed from large planar conductor plates. In addition, there is a need for improved semiconductor processes and devices to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
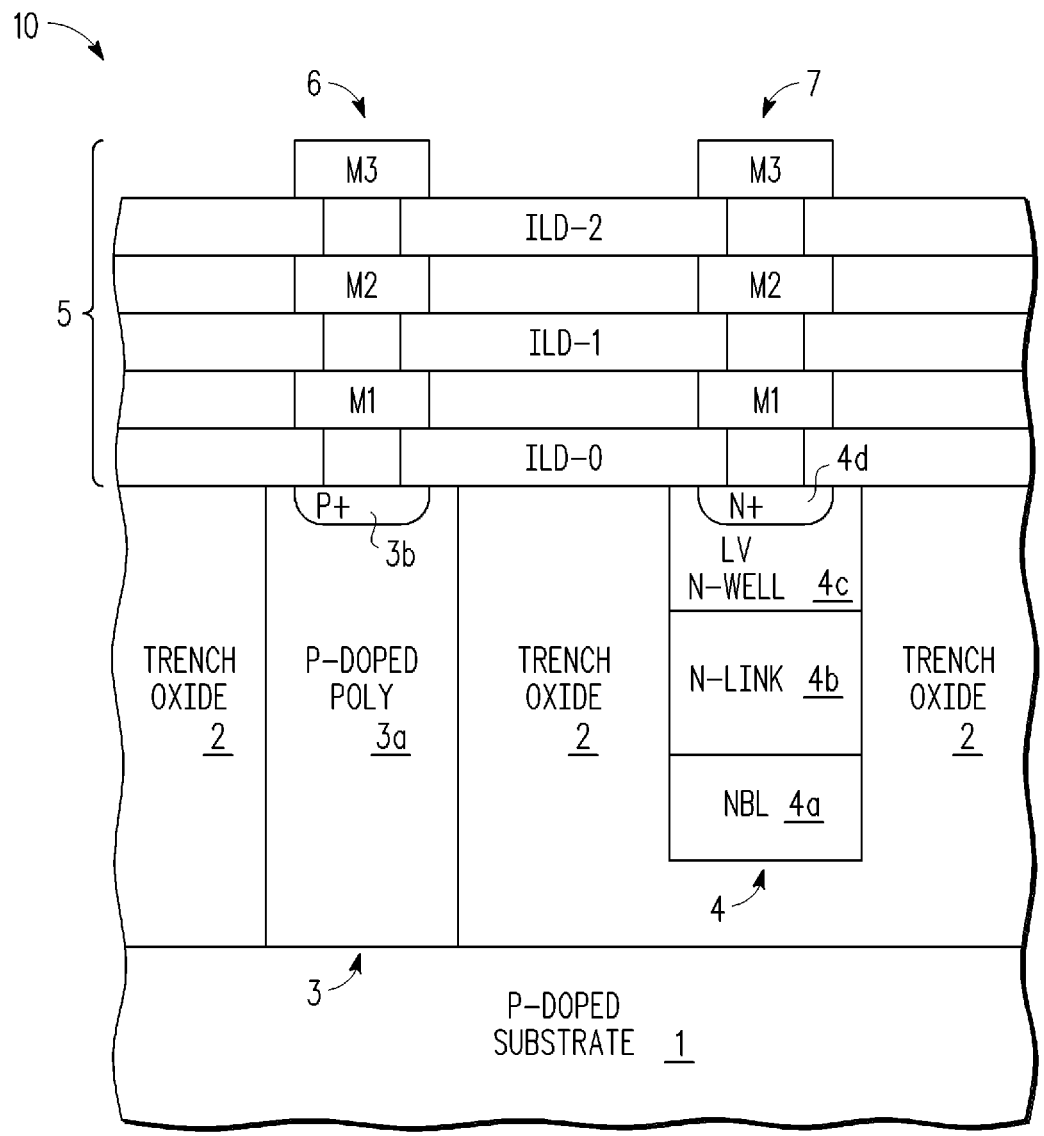
FIG. 1 is a partial cross-sectional view of a high voltage deep trench capacitor in accordance with selected embodiments of the present invention.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for fabricating high voltage deep trench integrated circuit capacitor structure. In selected embodiments illustrated with a partial cross-sectional view in FIG. 1, the high voltage deep trench capacitor 10 is fabricated in a trench oxide layer 2 over a substrate 1. The capacitor 10 includes a first capacitor plate 3 which is formed using a first semiconductor layer 3a (e.g., p-doped polysilicon) that is tied or terminated to the substrate 1. The capacitor 10 also includes a second capacitor plate 4 which is formed using a second semiconductor layer that is not tied to the substrate 1. For example, the second capacitor plate 4 may be formed from an n-doped semiconductor layer that is not tied to the substrate, but is instead isolated from the substrate 1 by a dielectric layer (e.g., the buried oxide layer). The second capacitor plate 4 may be formed from any conductive material that serves an electrode function, such as a single doped semiconductor layer, but in the depicted embodiment, the second capacitor plate 4 is formed from an n-doped SOI semiconductor layer 4 which includes an N+ buried layer (NBL) 4a, an N-link layer 4b and a low voltage n-well layer 4c. When the high voltage deep trench capacitor structure is formed in parallel with metal fringe capacitor 5, the linearity of the capacitor can be improved further by extending the first plate 3 with the metal contact layer 6, and by extending the second plate 4 with the metal contact layer 7.

Various illustrative embodiments will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Figure 2:
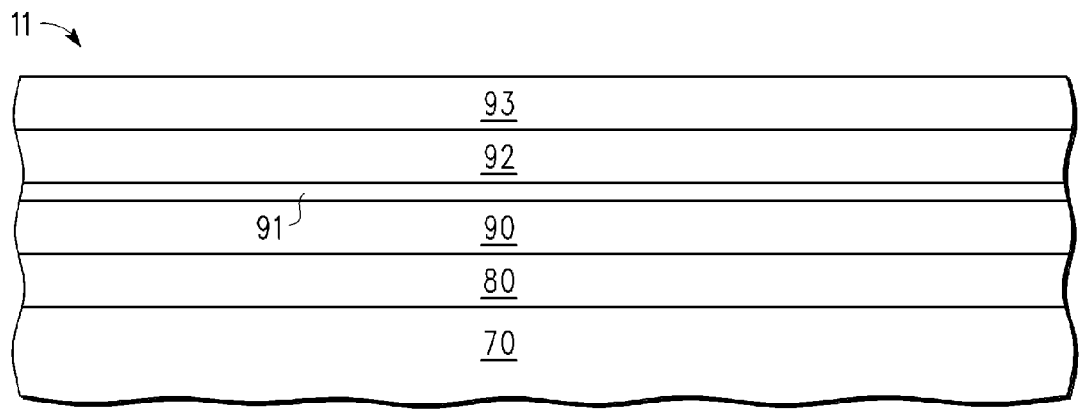
FIG. 2 is a partial cross-sectional view of a semiconductor wafer structure on which mask layers are formed over SOI layers and a semiconductor substrate.

Turning now to FIG. 2, a partial cross-sectional view is illustrated of a semiconductor wafer structure 11 on which mask layers 91, 92, 93 are formed over semiconductor-on-insulator (SOI) layers, including SOI semiconductor layer 90 and SOI insulating dielectric layer 80 (e.g., buried oxide layer), which in turn are formed over a semiconductor substrate layer 70. Specifically, the structure 11 includes a first semiconductor layer 70 formed of a semiconductor material which may have a first crystallographic orientation. Depending on the type of transistor device being fabricated, the first semiconductor layer 70 may be implemented as a bulk silicon substrate, single crystalline silicon (doped or undoped), SOI substrate, or any semiconductor material including, for example, Si, SiC, SiGe, SiGeC, Ge, GaAs, InAs, InP as well as other Group III-V compound semiconductors or any combination thereof, and may optionally be formed as the bulk handling wafer. As will be appreciated, the semiconductor layer 70 may be appropriately doped to provide n-type (electron) and p-type (hole) carriers.

In the SOI layers, the structure 11 includes an insulator layer 80 formed on the first semiconductor layer 70 which will ultimately be used to form the buried oxide (BOX) layer for semiconductor-on-insulator devices. In addition, the SOI layers include a second semiconductor layer 90 formed of a semiconductor material which may have a second crystallographic orientation which is different from the first crystallographic orientation, though as will be appreciated, it is not necessary that the second semiconductor layer 90 have a different crystallographic orientation. Depending on the type of transistor device being fabricated, the second semiconductor layer 90 may be formed from any semiconductor material, including, for example, Si, SiC, SiGe, SiGeC, Ge, GaAs, InAs, InP as well as other Group IV, III/V or II/VI compound semiconductors or any combination thereof. It will also be appreciated that the second semiconductor layer 90 may be appropriately doped to provide n-type (electron) and p-type (hole) carriers.

The mask layers shown in FIG. 2 may be formed by depositing or growing a first dielectric layer 91 (e.g., pad oxide) on the second semiconductor layer 90. Subsequently, an additional masking layer 92 is deposited over the first dielectric layer 91 using an appropriate masking layer material. For example, a layer of silicon nitride may be deposited to a predetermined thickness (e.g., 1400 Angstroms). On top of the nitride layer, a hardmask layer is formed, such as by depositing a layer of plasma enhanced TEOS to a predetermined thickness (e.g., 6000 Angstroms).

Figure 3:
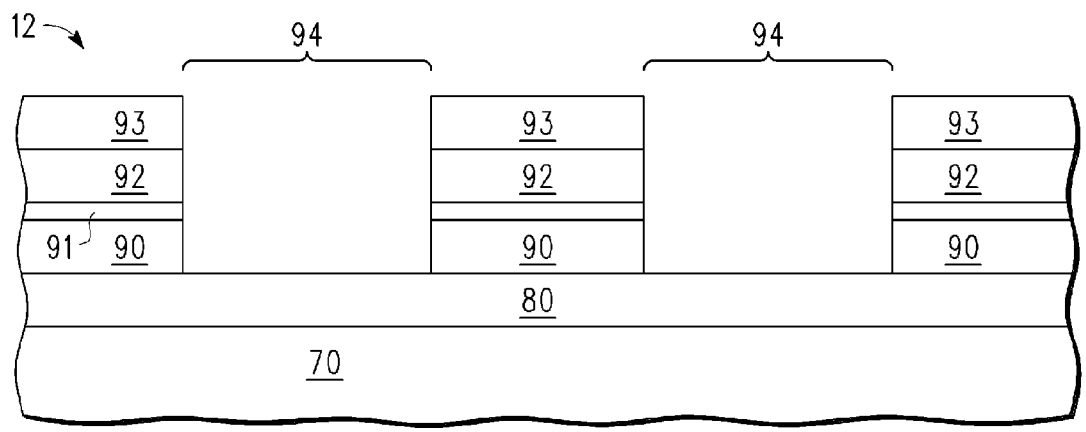
FIG. 3 illustrates processing subsequent to FIG. 2 where portions of at least an SOI semiconductor layer have been etched or removed to form one or more first trench openings.

FIG. 3 illustrates processing of the wafer structure 12 subsequent to FIG. 2 where the masking layers 91, 92, 93 are used to selectively etch or remove portions of at least the SOI semiconductor layer 90 to form one or more first trench openings 94. Any desired patterning and anisotropic etching techniques may be used to form the first trench opening(s) 94, including a dry etching process such as reactive-ion etching, ion beam etching, plasma etching or laser etching, a wet etching process wherein a chemical etchant is employed or any combination thereof. In an example embodiment, a patterned layer of photoresist (not shown) may be used to define and etch the hardmask layer 93 to serve as a mask for a hardmask etch process which etches down to the second semiconductor layer 90 by removing exposed portions of the hardmask layer 93, nitride layer 92 and pad oxide layer 91. After the hardmask etch process, the photoresist is stripped (e.g., with an ash/piranha process), and one or more deep trench etches are performed to etch down to at least the buried oxide layer 80 (as shown in FIG. 3), if not also to the first semiconductor layer 70 (not shown). Though not illustrated to scale in the figures, it will be appreciated that the deep trench etch process(es) may thin the hardmask layer 93. The first trench openings 94 define the regions in which the substrate-terminated deep trench capacitor plates will be formed.

Figure 4:
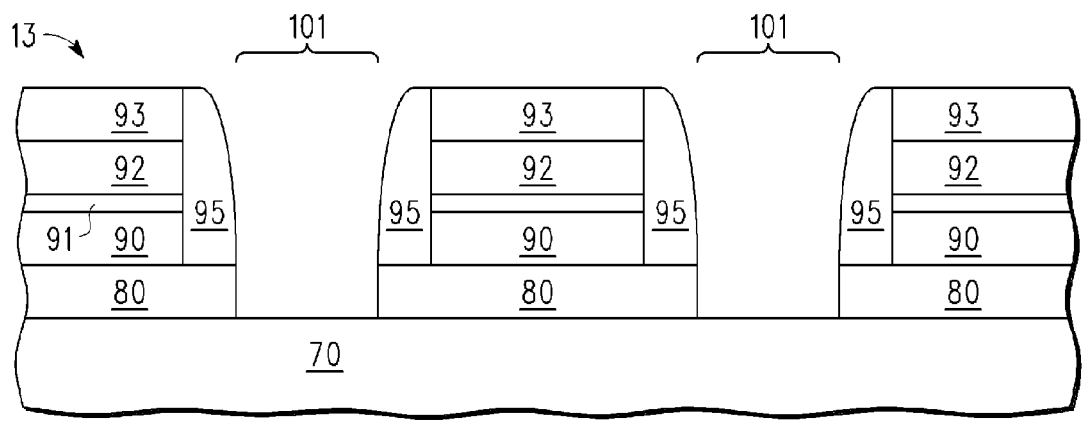
FIG. 4 illustrates processing subsequent to FIG. 3 after trench oxide regions are formed on the sidewalls of the first trench opening(s), thereby exposing the substrate layer.

FIG. 4 illustrates processing of the wafer structure 13 subsequent to FIG. 3 after trench oxide regions 95 are formed on the sidewalls of the first trench openings 94 to thereby define one or more second trench openings 101 that expose a portion of the first semiconductor layer within the first trench opening areas 94. While any desired technique may be used to form the trench oxide regions on the vertical surfaces of the first openings 94, one or more relatively thick dielectric layers (e.g., a 7500 Angstroms layer of high density plasma oxide) are deposited over the wafer structure 13 using any desired deposition process, and then anisotropically etched to form the sidewall spacers 95. In an example embodiment, a first trench oxide liner may be formed to a predetermined thickness (e.g., 137 Angstroms) after cleaning the wafer structure by depositing and densifying a trench oxide layer to a predetermined thickness (e.g., 7500 Angstroms of TEOS). As deposited, the trench oxide layer will cover the remaining hardmask layer 93, trench oxide regions 95 and exposed buried oxide layer 80. With the trench oxide layer in place, a high aspect ratio anisotropic oxide etch process may be performed to clear a portion of the first semiconductor layer 70 while leaving sidewall spacers 95 on the sidewalls of the first openings 94. Depending on the constituent materials and dimensions of the deposited dielectric layer(s), the etching may use one or more anisotropic etch processes to form sidewall spacers 95, including a dry etching process (such as reactive-ion etching, ion beam etching, plasma etching, laser etching), or any combination thereof. To the extent that the trench oxide regions 95 will be used to form the dielectric layer between the capacitor plates in the finally formed capacitor structure (as described below), the processing details may be selected to obtain the oxide thickness enough to support required voltage (e.g., approximately 0.5 um for 40 V applications).

Figure 5:
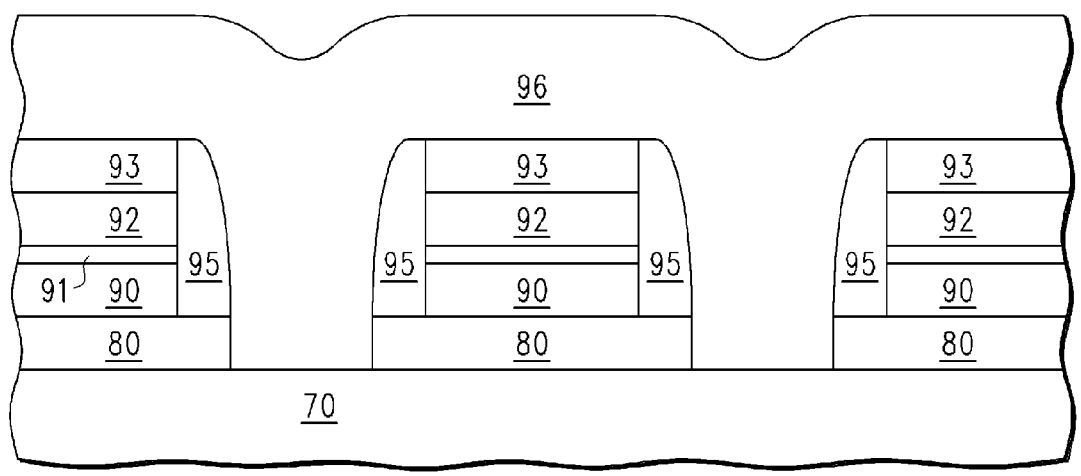
FIG. 5 illustrates processing subsequent to FIG. 4 after a semiconductor layer is deposited.

FIG. 5 illustrates processing of the wafer structure 14 subsequent to FIG. 4 after a semiconductor layer 96 is deposited. The semiconductor layer 96 may be formed from doped or undoped polysilicon that is blanket deposited over the remaining hardmask layer 93 and the trench oxide regions 95 by CVD, PECVD, PVD, ALD, or combinations thereof to a thickness that is sufficient to completely fill the first trench openings 94. However, in an example embodiment, the semiconductor layer 96 is formed by depositing a layer of highly doped polysilicon (e.g., with a boron concentration of at least $1E19/cm^3$) to a predetermined thickness (e.g., 8000 Angstroms). As deposited, the semiconductor layer 96 is formed to contact the exposed portions of the substrate layer 70, and to promote the contact with the substrate layer 70, a clean or argon sputter process may be performed prior to depositing the semiconductor layer 96. As will be appreciated, other processing steps may be used to fill the first trench openings with a semiconductor layer 96, including but not limited to using a selective epitaxial semiconductor growth process to fill the first trench openings 94 with an epitaxial semiconductor layer.

Figure 6:
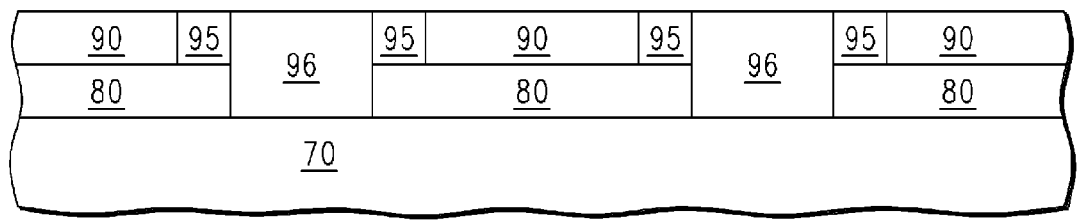
FIG. 6 illustrates processing subsequent to FIG. 5 after the semiconductor layer, mask layer and portions of the trench oxide regions have been etched or removed, such as by applying a CMP polish to the semiconductor wafer structure.

FIG. 6 illustrates processing of the wafer structure 15 subsequent to FIG. 5 after the semiconductor layer 96 is polished and/or etched back until substantially coplanar with the second semiconductor layer 90, such as by applying a chemical mechanical polish (CMP) step to the semiconductor wafer structure 15, alone or in combination with additional etching, stripping and/or cleaning processes. In a selected embodiment, the polish and/or etch process is used to remove the remaining hardmask layer 93, nitride mask layer 92, oxide layer 91 and portions of the trench oxide regions 95 while polishing the semiconductor layer 96.

Figure 7:
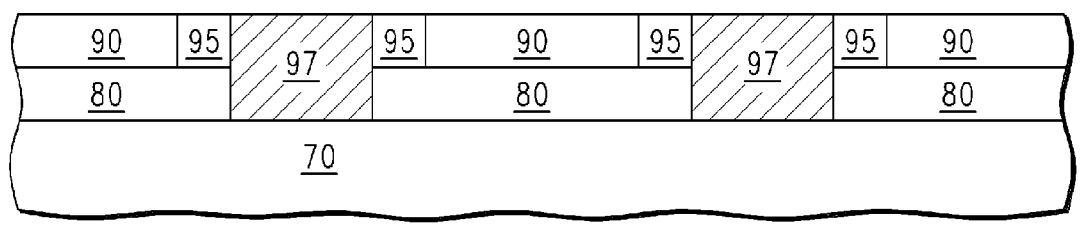
FIG. 7 illustrates processing subsequent to FIG. 6 after the polished semiconductor layer and SOI semiconductor layers are doped.

FIG. 7 illustrates processing of the wafer structure 16 subsequent to FIG. 6 after the polished semiconductor layer 97 and SOI semiconductor layers 90 are selectively doped. While the SOI semiconductor layer 90 and semiconductor layer 96 may be originally formed as highly doped layers (as described above), the doping may separately be controlled at this stage. For example, by masking off the SOI semiconductor layers 90 with a first implant mask (not shown), the semiconductor layer 97 may be implanted with p-type impurities until a doping concentration is obtained of approximately $5E18$ to $5E19/cm^3$. Alternatively, the semiconductor layer 97 may be in-situ doped to this concentration during the deposition process. As will be appreciated, the SOI semiconductor layer 90 may also be doped until sufficiently conductive to serve as a capacitor plate. The doping/implantation of the SOI semiconductor layer 90 can occur when the SOI semiconductor layer is initially formed (i.e., earlier in the process). Alternatively, the SOI semiconductor layer 90 can be doped before or after the doping of the semiconductor layer 97. For example, the SOI semiconductor layer 90 may be implanted with n-type impurities until the SOI semiconductor layer 90 is sufficiently conductive to serve as a capacitor plate, such as by implanting an n-type dopant with a doping concentration from $5E17$ to $5E19/cm^3$, though different implantation steps using different doping concentrations and/or implant energies can be used. Any desired implantation process or sequence may be used that transforms the SOI semiconductor layer 90 into a conductive electrode, but in an example embodiment, the SOI semiconductor layer 90 is doped with separate implantation steps to form a first N+ buried layer (NBL) at the bottom of the SOI semiconductor layer 90, a second N-link layer above the NBL layer, and a third low voltage n-well layer above the N-link layer. As will be appreciated, the implanted impurities will be activated with a subsequent heat or anneal step.

Figure 8:
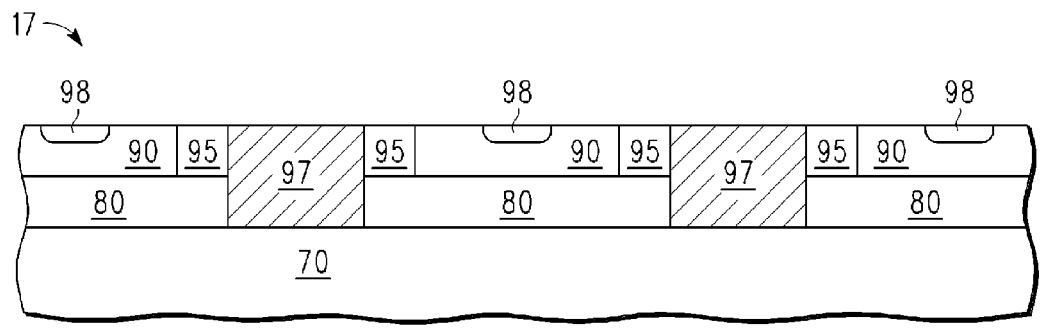
FIG. 8 illustrates processing subsequent to FIG. 7 after highly doped regions are formed in the SOI semiconductor layer.

FIG. 8 illustrates processing of the wafer structure 17 subsequent to FIG. 7 after highly doped regions 98 are formed in the SOI semiconductor layer 90. For example, by masking off wafer structure 17 except where the highly doped regions 98 are to be formed with an implant mask (not shown), the exposed portions of the SOI semiconductor layer 90 may be implanted with n-type impurities until N+ regions 98 are formed in the SOI semiconductor layer 90. The highly doped regions 98 are provided to make electrical contact with the subsequently formed metal contacts, and may be formed using any desired contact and/or silicide formation sequence.

Figure 9:
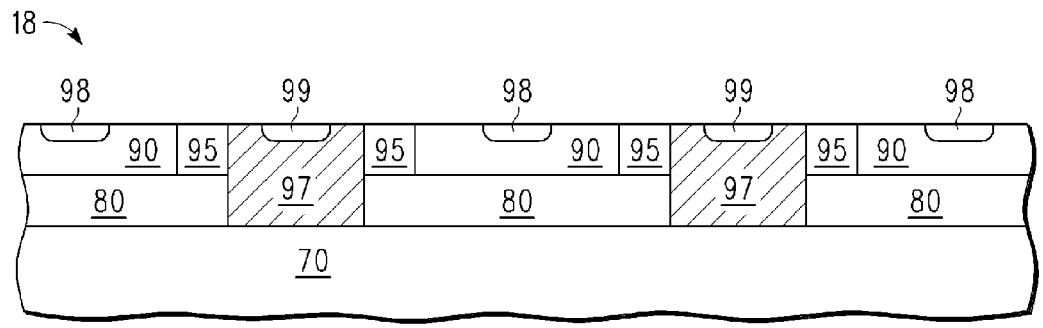
FIG. 9 illustrates processing subsequent to FIG. 8 after highly doped regions are formed in the semiconductor layer.

FIG. 9 illustrates processing of the wafer structure 18 subsequent to FIG. 8 after highly doped regions 99 are formed in the semiconductor layer 97. For example, by masking off wafer structure 18 except where the highly doped regions 99 are to be formed with an implant mask (not shown), the exposed portions of the semiconductor layer 97 may be implanted with p-type impurities until P+ regions 99 are formed in the semiconductor layer 97. As with the doped regions 98, the highly doped regions 99 are provided to make electrical contact with the subsequently formed metal contacts, and may be formed using any desired contact and/or silicide formation sequence.

Figure 10:
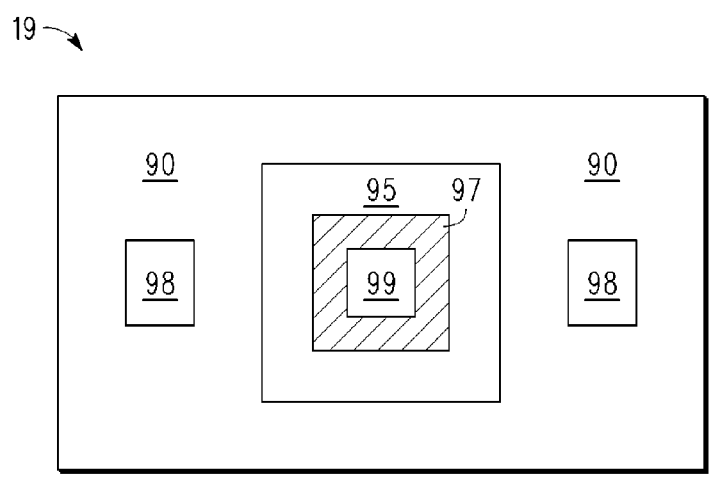
FIG. 10 illustrates a partial plan view of the semiconductor wafer structure shown in FIG. 9.

FIG. 10 illustrates a partial plan view of the semiconductor wafer structure 19 shown in FIG. 9. As depicted, the semiconductor layer 97 and SOI semiconductor layer 90 may be laid out to form a capacitor with the SOI semiconductor layer 90 encircling the centrally positioned semiconductor layer 97. However, it will be appreciated that other layout configurations may be used, such as forming a capacitor with the semiconductor layer 97 being laterally displaced from the SOI semiconductor layer 90. In any layout, the design rules will specify a minimum predetermined spacing for the trench oxide regions 95 separating the semiconductor layer 97 and SOI semiconductor layer 90.

Figure 11:
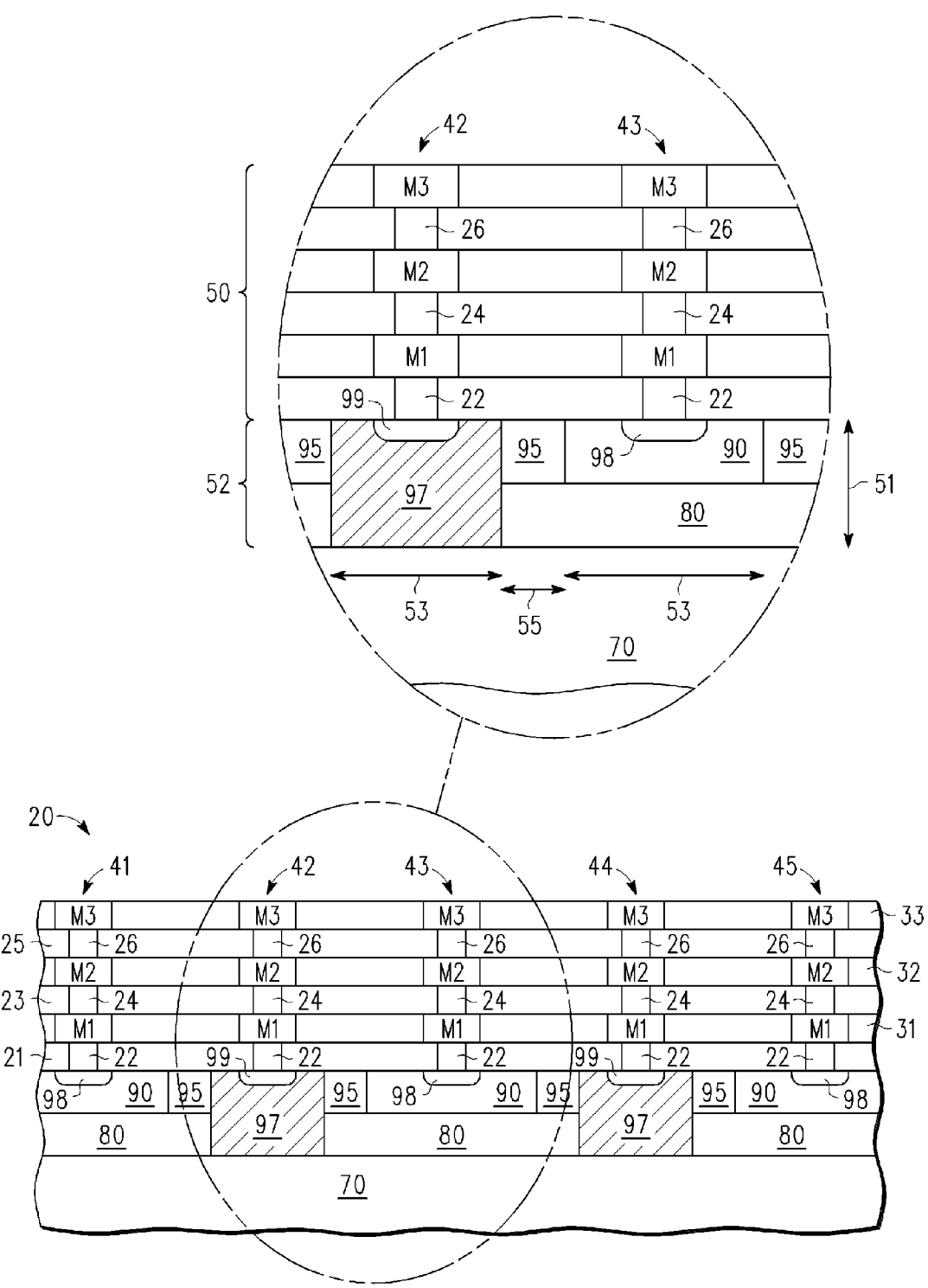
FIG. 11 illustrates processing subsequent to FIG. 9 after one or more interlayer dielectric and metal layers are selectively formed, thereby forming a fringe metal capacitor over the semiconductor wafer structure.

FIG. 11 illustrates processing wafer structure 20 subsequent to FIG. 9 after one or more interlayer dielectric and metal layers 50 are selectively formed, thereby forming a fringe metal capacitor over the semiconductor wafer structure. As illustrated, a planarized first interlayer dielectric layer (ILD0) 21 formed over the wafer structure is selectively etched to form contact openings in which contact regions 22 are formed from one or more metal or metal-based layers. Over the ILD0 layer 21, a planarized first dielectric layer 31 is deposited and selectively etched to form openings in which a first metal region M1 is formed from one or more metal or metal-based layers. In similar fashion, a planarized second interlayer dielectric layer (ILD1) 23 is formed and selectively etched to form via openings in which via regions 24 are formed, followed by deposition of a planarized dielectric layer 32 that is selectively etched to form openings in which a second metal region M2 is formed. Finally, a planarized third interlayer dielectric layer (ILD2) 25 is formed and selectively etched to form via openings in which via regions 26 are formed, followed by deposition of a planarized dielectric layer 33 that is selectively etched to form openings in which a third metal region M2 is formed. As will be appreciated, the fringe capacitor may be formed with any desired number of M metal layers.

In accordance with the example sequence described above, a high voltage deep trench capacitor may be formed that can handle on the order of approximately 40 volts. For example, if the effective width 53 of each of the plate layers 97, 90 is 0.5 um, and if the effective dielectric separation 55 from the trench oxide 95 is 0.5 um, then the capacitance per 1 um of depth is 0.07 $fF/um^2$ of silicon surface area. With an effective trench depth 51 of 6.5 um for the semiconductor wafer structure 20, this results in a capacitance of 0.455 $fF/um^2$ which is due to the deep trench capacitor 52 alone. The effective capacitance may be increased by adding a metal capacitor 50 in parallel with the deep trench capacitor 52. This is illustrated in FIG. 11, where a first stack 42 of metal regions are formed over the semiconductor layer 97, and a second stack 43 of metal regions are formed over the SOI semiconductor layer 90, in effect creating a fringe capacitor. The presence of the fringe capacitor adds a capacitance density of 0.28-0.3 fF/um$^2$ in an example embodiment where there are three metal layers spaced apart by 0.455 um. Thus, the combination of the deep trench capacitor and fringe capacitor increases the capacitance density. In addition, the presence of the fringe capacitor improves the linearity of the deep trench capacitor.

It will be appreciated that additional processing steps will be used to fabricate the capacitor structure described herein, such as a nitride strip process, preparation and formation of one or more sacrificial oxide layers, shallow trench isolation regions, and formation of various buried well or regions. In addition, other circuit features may be formed on the wafer structure, such as transistor devices. As examples, one or more sacrificial oxide formation, stripping, isolation region formation, well region formation, gate dielectric and electrode formation, extension implant, halo implant, spacer formation, source/drain implant, heat drive or anneal steps, and polishing steps may be performed, along with conventional backend processing (not depicted), typically including formation of multiple levels of interconnect that are used to connect the transistors in a desired manner to achieve the desired functionality. Thus, the specific sequence of steps used to complete the fabrication of the semiconductor structures may vary, depending on the process and/or design requirements.

In one form, there is provided herein a method for fabricating a deep trench capacitor. As disclosed, a first semiconductor layer and a second semiconductor layer are provided, where the second semiconductor layer is formed over at least part of the first semiconductor layer and is separated therefrom by an insulator layer. A first trench opening having substantially vertical sidewalls is formed by selectively removing at least a portion of the second semiconductor layer (if not also the insulator layer) in a first region to leave a remaining portion of the second semiconductor layer in a second region. On the sidewalls of the first trench opening, a deep trench oxide region is formed. In addition, a second trench opening is formed that exposes a portion of the first semiconductor layer in the first region. In selected embodiments, a single etch process is used to form the trench oxide region on at least one of the sidewalls of the first trench opening and to form the second trench opening that exposes a portion of the first semiconductor layer in the first region, though separate etch processes may also be used. In selected embodiments, the deep trench oxide regions may be formed by depositing an insulating material in first trench opening to conformally cover the substantially vertical sidewalls in the first trench opening and any portion of the first semiconductor layer that was exposed when forming the first trench opening, and then selectively etching the insulating material in the first trench opening to form a deep trench oxide region on at least one of the sidewalls of the first trench opening. In other embodiments, the deep trench oxide regions may be formed by depositing an insulating material in the first trench opening to conformally cover the substantially vertical sidewalls in the first trench opening and any remaining insulator layer that was not removed when forming the first trench opening, and then selectively etching the insulating material and any remaining insulator layer in the first trench opening to form a trench oxide region on at least one of the sidewalls of the first trench opening, thereby defining a second trench opening that exposes a portion of the first semiconductor layer. In the second trench opening, a doped semiconductor layer (e.g., polysilicon) is formed that is tied to the first semiconductor layer, and that may be planarized along with the second semiconductor layer. At the time of formation or subsequently, the second semiconductor layer is doped with n-type impurities to form a first capacitor plate, and the doped semiconductor layer is doped with p-type impurities to form a second capacitor plate that is separated from the first capacitor plate by the deep trench oxide region. For example, the second semiconductor layer may be doped with n-type impurities to define a first N+ buried layer, an N-link layer and a low voltage n-well layer. In selected embodiments, a fringe capacitor may be formed over the deep trench capacitor by forming M metal regions over the first capacitor plate and over the second capacitor plate, where the M metal regions over the first capacitor plate are separated from the M metal regions over the second capacitor plate by one or more dielectric layers.

In another form, there is provided an integrated circuit deep trench capacitor structure and fabrication method whereby a first capacitor plate is formed from a doped SOI semiconductor layer (e.g., a semiconductor layer that is highly doped with n-type impurities) that is separated from a substrate layer (e.g., p-type substrate) by a buried insulator layer. In addition, a second capacitor plate is formed from a doped semiconductor layer (e.g., a polysilicon layer that is highly doped with p-type impurities) that is formed in a deep trench oxide region that may be formed from a densified TEOS layer. By forming the doped semiconductor layer in contact with the substrate, the second capacitor plate is tied to the substrate layer. As formed, the first and second capacitor plates are separated from one another by the deep trench oxide region. For example, the doped SOI semiconductor layer may be formed in the deep trench oxide region to encircle a centrally positioned doped semiconductor layer so that the doped SOI semiconductor layer is separated from the centrally positioned doped semiconductor layer by part of the deep trench oxide region. A fringe capacitor may be formed over the deep trench capacitor by forming one or more metal regions over the first capacitor plate so that they are electrically connected together, and by separately forming one or more metal regions over the second capacitor plate so that they are electrically connected together. With this structure, the metal regions formed over the first capacitor plate are separated from the metal regions formed over the second capacitor plate by one or more dielectric layers, thereby forming the fringe capacitor.

In yet another form, there is provided method of forming a deep trench capacitor. As disclosed, a first substrate layer (e.g., p-type substrate) and a second substrate layer are provided, where the second substrate layer is formed over the first substrate layer and is separated from the first substrate layer by a buried insulator layer. Deep trenches are etched through the second substrate layer and to at least the buried insulator layer, and deep trench oxide regions are formed on the sidewalls of the deep trenches which leave exposed the first substrate layer within the deep trenches. In an example implementation, the deep trench oxide regions are formed by depositing a conformal trench oxide layer in the deep trenches, and then anisotropically etching the conformal trench oxide layer to expose the first substrate layer within the deep trenches. Once the deep trench oxide regions are formed, a doped polysilicon layer (e.g., highly doped p-type poly) is deposited over the deep trench oxide regions to fill the deep trenches, where the doped polysilicon layer contacts the exposed first substrate layer. Subsequently, the doped polysilicon layer and the second substrate layer are planarized at least in part with a chemical mechanical polish step. The final integrated circuit structure forms a first capacitor plate from the second substrate layer that is doped with impurities (e.g., n-type impurities), and forms a second capacitor plate from the doped polysilicon layer that is doped with impurities (e.g., p-type impurities), where the second capacitor plate is separated from the first capacitor plate by the deep trench oxide region. After the integrated circuit structure is formed, additional capacitance can be added by forming M metal regions over the first capacitor plate and over the second capacitor plate, where the M metal regions formed over the first capacitor plate are separated from the M metal regions formed over the second capacitor plate by one or more dielectric layers.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, different dopant types and concentrations may be used than disclosed herein. Moreover, the dimensions of the described layers may deviate from the disclosed dimension values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit deep trench capacitor structure, comprising:
    a first capacitor plate formed from a doped SOI semiconductor layer that is separated from a substrate layer by a buried insulator layer;
    a trench oxide layer that is located in a first trench opening formed in the doped SOI semiconductor layer and adjacent to the first capacitor plate, where the first trench opening exposes the buried isolation layer; and
    a second capacitor plate that is located in a second trench opening formed in the trench oxide layer and buried isolation layer to expose a portion of the substrate layer, the second capacitor plate comprising a doped semiconductor layer that is located adjacent to the trench oxide layer and that is tied to the substrate layer;
    where the first and second capacitor plates are separated from one another by the trench oxide layer and where the second trench opening is positioned inside the first trench opening.

2. The capacitor structure of claim 1, where the first capacitor plate comprises a SOI semiconductor layer that is highly doped with n-type impurities.

3. The capacitor structure of claim 1, where the second capacitor plate comprises a semiconductor layer that is highly doped with p-type impurities.

4. The capacitor structure of claim 1, where the substrate layer comprises a p-type substrate layer.

5. The capacitor structure of claim 1, where the doped semiconductor layer is formed to encircle the doped SOI semiconductor layer so that the doped SOI semiconductor layer is separated from the centrally positioned doped semiconductor layer by part of the trench oxide layer.

6. The capacitor structure of claim 1, further comprising a fringe capacitor comprising:
    a first plurality of metal layers formed in alignment over and electrically connected to the first capacitor plate to form a first fringe capacitor plate; and
    a second plurality of metal layers formed in alignment over and electrically connected to the second capacitor plate to form a second fringe capacitor plate capacitively coupled to the first fringe capacitor plate,
    where the first plurality of metal layers formed in alignment over the first capacitor plate are separated from the second plurality of metal layers formed in alignment over the second capacitor plate by one or more dielectric layers.

7. An integrated circuit deep trench capacitor structure, comprising:
    a first capacitor plate formed from a first doped semiconductor layer that is separated from a substrate layer by buried isolation dielectric layer;
    a trench oxide region that is located in a first trench opening formed in the first doped semiconductor layer to expose the buried isolation dielectric layer, where the trench oxide region is adjacent to the first capacitor plate; and
    a second capacitor plate that is located in a second trench opening formed in the trench oxide region and buried isolation dielectric layer to expose a portion of the substrate layer, the second capacitor plate comprising a second doped semiconductor layer that is tied to the substrate layer;
    where the first and second capacitor plates are separated from one another by at least part of the trench oxide regions which forms a deep trench capacitor dielectric layer between the first and second capacitor plates.

8. The capacitor structure of claim 7, where the first capacitor plate comprises a semiconductor layer that is highly doped with n-type impurities.

9. The capacitor structure of claim 7, where the second capacitor plate comprises a semiconductor layer that is highly doped with p-type impurities.

10. The capacitor structure of claim 7, where the substrate layer comprises a p-type substrate layer.

11. The capacitor structure of claim 7, where the second trench opening is formed within the first trench opening.

12. The capacitor structure of claim 7, where the first doped semiconductor layer is formed encircles a centrally positioned second doped semiconductor layer.

13. The capacitor structure of claim 7, further comprising a fringe capacitor comprising:
    a first plurality of metal layers formed in alignment over and electrically connected to the first capacitor plate to form a first fringe capacitor plate; and
    a second plurality of metal layers formed in alignment over and electrically connected to the second capacitor plate to form a second fringe capacitor plate capacitively coupled to the first fringe capacitor plate, where the first plurality of metal layers formed in alignment over the first capacitor plate are separated from the second plurality of metal layers formed in alignment over the second capacitor plate by one or more dielectric layers.

14. An integrated circuit deep trench capacitor, comprising:
   a substrate;
   one or more trench oxide sidewall layers formed over the substrate in a first deep trench opening which exposes a buried isolation dielectric layer formed on the substrate;
   a first doped semiconductor layer formed as a first capacitor plate in a second trench opening formed inside the first deep trench opening and through the buried isolation dielectric layer to expose the substrate, where the first doped semiconductor layer is tied to the substrate; and
   a second doped semiconductor layer formed as a second capacitor plate formed outside of the first trench opening and electrically insulated from the substrate by the buried isolation dielectric layer, where the one or more trench oxide sidewall layers form a deep trench capacitor dielectric layer between the first and second capacitor plates.

15. The integrated circuit deep trench capacitor of claim 14, where the second doped semiconductor layer is formed from a doped semiconductor-on-insulator layer that is isolated from the substrate by the buried isolation dielectric layer.

16. The integrated circuit deep trench capacitor of claim 14, where the second capacitor plate comprises a SOI semiconductor layer that is highly doped with n-type impurities and the substrate comprises a p-type substrate layer.

17. The integrated circuit deep trench capacitor of claim 14, where the first capacitor plate comprises a semiconductor layer that is highly doped with p-type impurities.

18. The integrated circuit deep trench capacitor of claim 14, where the second doped semiconductor layer is formed to encircle a centrally positioned first doped semiconductor layer so that the second doped semiconductor layer is separated from the centrally positioned first doped semiconductor layer by at least a part of the one or more trench oxide sidewall layers.

19. The integrated circuit deep trench capacitor of claim 14, further comprising a fringe capacitor comprising:
   a plurality of metal layers formed in alignment over and electrically connected to the first capacitor plate; and
   a plurality of metal layers formed in alignment over and electrically connected to the second capacitor plate,
   where the plurality of metal layers formed in alignment over the first capacitor plate are separated from the plurality of metal layers formed in alignment over the second capacitor plate by one or more dielectric layers.

* * * * *